US012309979B2

(12) United States Patent
Duncan et al.

(10) Patent No.: US 12,309,979 B2
(45) Date of Patent: May 20, 2025

(54) ADJUSTABLE HINGED MOUNTING BRACKET FOR A COMPUTING DEVICE

(71) Applicant: Dell Products L.P., Round Rock, TX (US)

(72) Inventors: Tyler Baxter Duncan, Austin, TX (US); Anthony Middleton, Cedar Park, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 233 days.

(21) Appl. No.: 17/970,318

(22) Filed: Oct. 20, 2022

(65) Prior Publication Data

US 2024/0138122 A1 Apr. 25, 2024
US 2024/0237301 A9 Jul. 11, 2024

(51) Int. Cl.
H05K 7/20 (2006.01)

(52) U.S. Cl.
CPC ..... H05K 7/20781 (2013.01); H05K 7/20272 (2013.01); H05K 7/20736 (2013.01)

(58) Field of Classification Search
CPC ........... H05K 7/20781; H05K 7/20272; H05K 7/20736
USPC .................................................... 361/679.47
See application file for complete search history.

(56) References Cited

U.S. PATENT DOCUMENTS

| | | | | |
|---|---|---|---|---|
| 5,210,680 A * | 5/1993 | Scheibler | ........... | H05K 7/20581 361/796 |
| 6,164,369 A * | 12/2000 | Stoller | ............... | H05K 7/20572 165/104.34 |
| 6,353,529 B1 * | 3/2002 | Cies | ...................... | G06F 1/1656 361/679.05 |
| 6,442,030 B1 * | 8/2002 | Mammoser | ............. | G06F 1/181 248/917 |
| 6,688,711 B1 * | 2/2004 | Mease | ..................... | G06F 1/183 361/679.58 |
| 6,873,883 B2 * | 3/2005 | Ziarnik | .............. | G05D 23/1912 702/132 |
| 7,016,191 B2 * | 3/2006 | Miyamoto | ........... | G11B 33/144 361/679.48 |
| 7,026,551 B2 * | 4/2006 | Franz | ................... | H05K 7/1448 174/72 A |
| 7,054,155 B1 * | 5/2006 | Mease | ................ | H05K 7/20581 165/104.34 |
| 7,142,425 B2 * | 11/2006 | Tomioka | ................. | G06F 1/206 174/15.1 |
| 7,189,924 B1 * | 3/2007 | Popescu | ............... | H05K 7/1491 361/825 |

(Continued)

*Primary Examiner* — Anatoly Vortman
(74) *Attorney, Agent, or Firm* — Chamberlain, Hrdlicka, White, Williams & Aughtry; Aly Z. Dossa

(57) ABSTRACT

A modular information technology component (MITC) includes: an information handling system (IHS); and a hinged bracket, in which the hinged bracket comprises a hinge, a base, and a holder, in which a first portion of the base is connected to the IHS, in which a second portion of the base is connected to the hinge, in which a first portion of the holder is connected to the hinge, in which a second portion of the holder is connected to an information technology component (ITC), in which the holder and the ITC are oriented in a first direction, and in which, after rotating inward or outward about the hinge, the holder and the ITC are oriented in a second direction, in which the first direction and the second direction are different.

15 Claims, 8 Drawing Sheets

(56) References Cited

U.S. PATENT DOCUMENTS

| | | | | |
|---|---|---|---|---|
| 7,385,810 B2* | 6/2008 | Chu | ............... | H05K 7/2079 361/679.48 |
| 7,580,259 B2* | 8/2009 | Hsiao | ............... | G06F 1/20 361/679.48 |
| 7,660,117 B2* | 2/2010 | Werner | ............... | H05K 7/20736 174/15.1 |
| 7,679,909 B2* | 3/2010 | Spearing | ............... | H05K 7/20645 165/80.4 |
| 7,813,121 B2* | 10/2010 | Bisson | ............... | H05K 7/20736 361/679.53 |
| 7,916,471 B2* | 3/2011 | Miyamoto | ............... | G11B 33/142 361/679.48 |
| 8,077,462 B2* | 12/2011 | Barringer | ............... | H05K 7/20818 361/698 |
| 8,164,897 B2* | 4/2012 | Graybill | ............... | H05K 7/20745 361/679.48 |
| 8,199,485 B2* | 6/2012 | Cheng | ............... | G06F 1/20 361/679.48 |
| 9,042,099 B2* | 5/2015 | Campbell | ............... | F28F 9/00 361/698 |
| 9,585,282 B1 | 2/2017 | Gandhi | | |
| 10,292,313 B2 | 5/2019 | Magallanes | | |
| 10,802,556 B2* | 10/2020 | North | ............... | H05K 7/20272 |
| 2003/0026084 A1* | 2/2003 | Lauchner | ............... | H05K 7/1491 361/826 |
| 2004/0042175 A1* | 3/2004 | Kehret | ............... | H05K 7/1434 361/690 |
| 2004/0182798 A1* | 9/2004 | Williams | ............... | H05K 7/1491 361/826 |
| 2007/0045479 A1* | 3/2007 | Nguyen | ............... | H05K 7/1491 211/151 |
| 2007/0230123 A1* | 10/2007 | Hata | ............... | H05K 7/207 361/695 |
| 2008/0060790 A1 | 3/2008 | Yates | | |
| 2008/0064317 A1 | 3/2008 | Yates | | |
| 2011/0094978 A1 | 4/2011 | Bailey | | |
| 2011/0315353 A1* | 12/2011 | Campbell | ............... | H05K 7/20809 165/104.31 |
| 2012/0119632 A1 | 5/2012 | Bousseton | | |
| 2012/0134104 A1 | 5/2012 | Driggers | | |
| 2012/0155027 A1 | 6/2012 | Broome | | |
| 2013/0032310 A1 | 2/2013 | Jaena et al. | | |
| 2013/0264026 A1* | 10/2013 | Eckberg | ............... | B23P 15/26 165/67 |
| 2014/0319985 A1 | 10/2014 | Kikuchi | | |
| 2015/0105930 A1 | 4/2015 | Sparrowhawk | | |
| 2017/0268239 A1 | 9/2017 | Kobayashi | | |
| 2018/0092227 A1 | 3/2018 | Stewart | | |
| 2018/0213673 A1 | 7/2018 | Eckberg | | |
| 2018/0223541 A1 | 8/2018 | Kobayashi | | |
| 2021/0127523 A1 | 4/2021 | Bailey | | |
| 2022/0007547 A1 | 1/2022 | Farshchian | | |
| 2023/0117815 A1 | 4/2023 | Ruiz Holguin | | |
| 2024/0138085 A1 | 4/2024 | Duncan | | |
| 2024/0138086 A1 | 4/2024 | Duncan | | |
| 2024/0138088 A1 | 4/2024 | Duncan | | |
| 2024/0138089 A1 | 4/2024 | Duncan | | |
| 2024/0138122 A1 | 4/2024 | Duncan | | |

\* cited by examiner

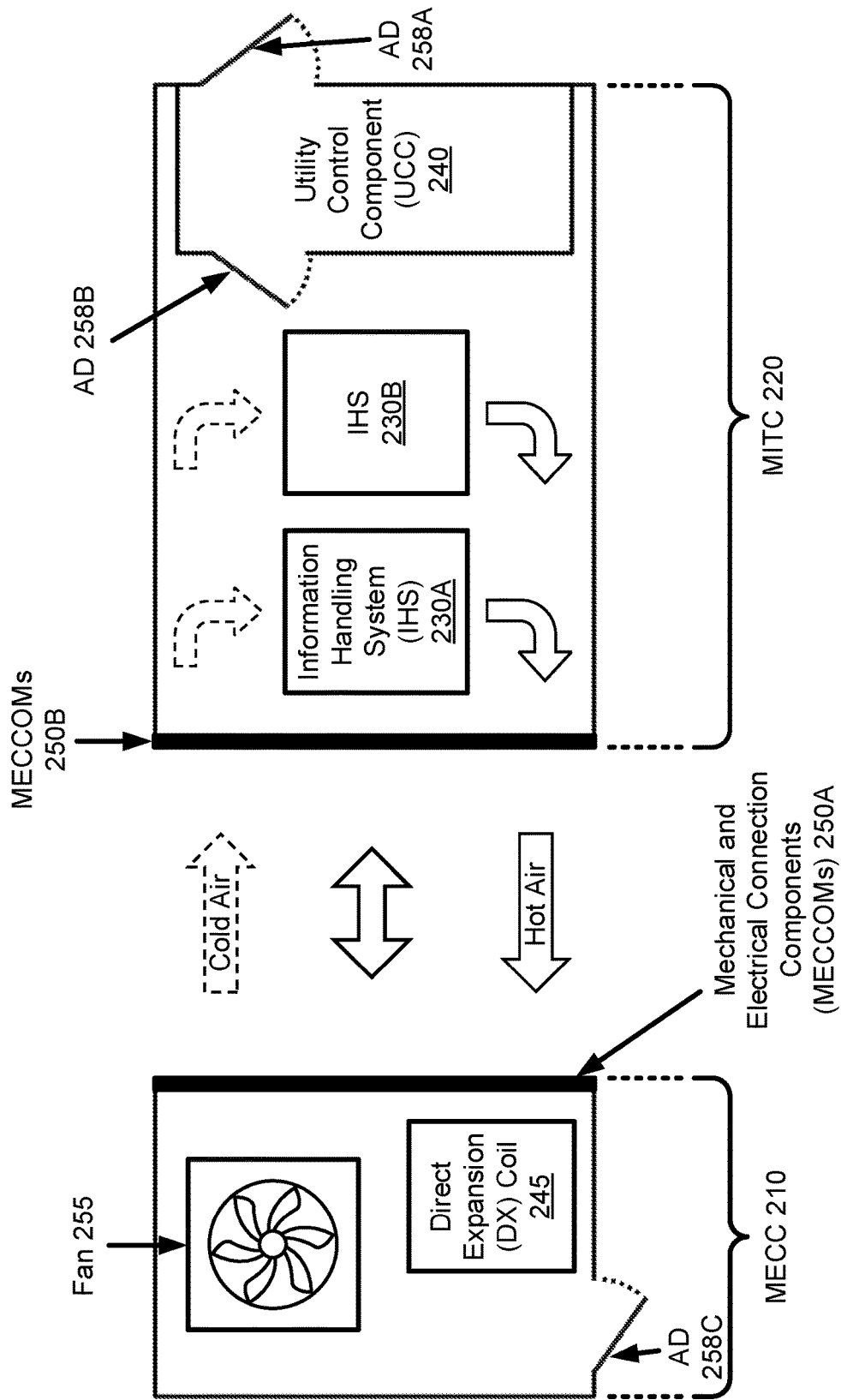
FIG. 2.1

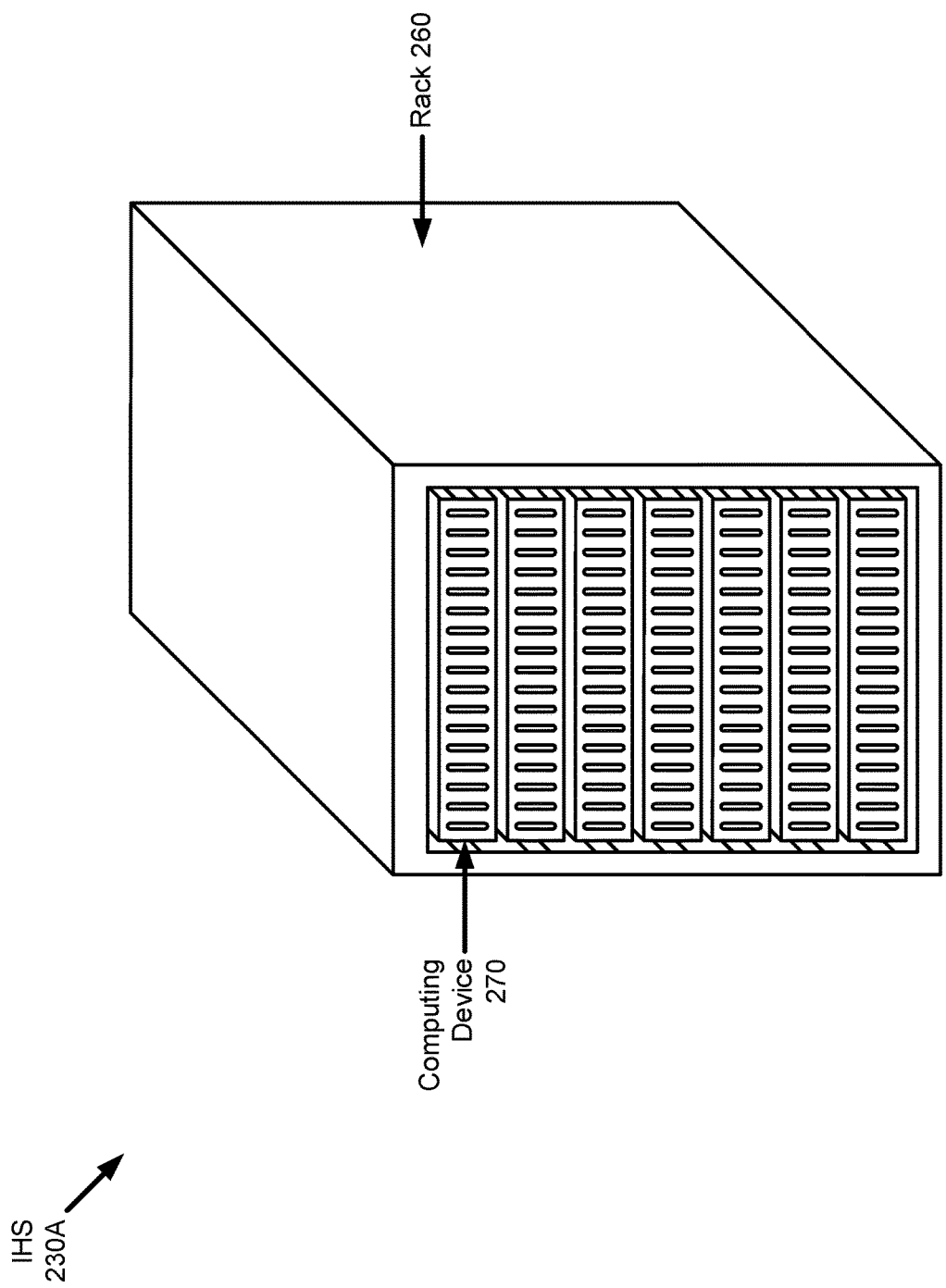
FIG. 2.2

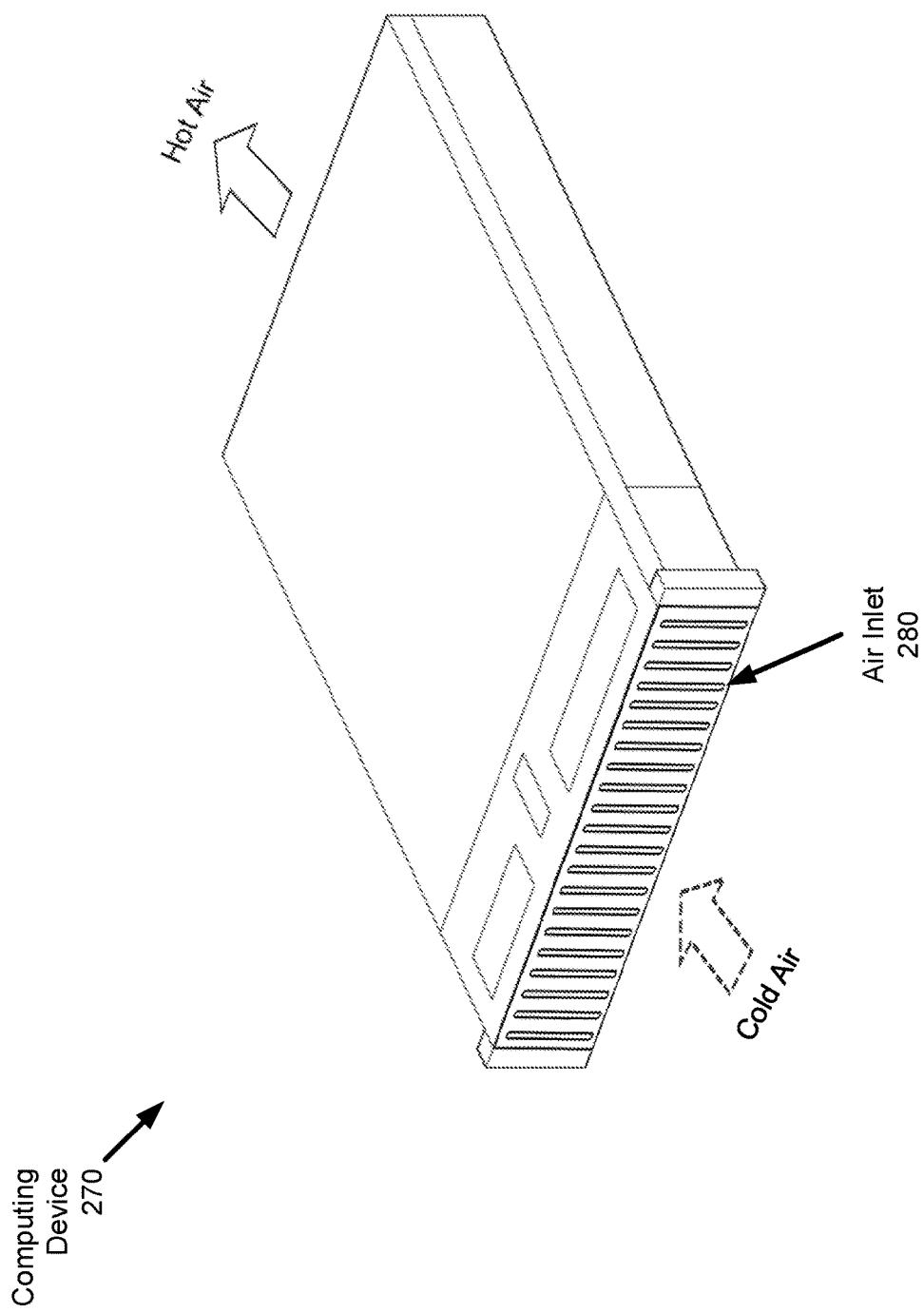
FIG. 2.3

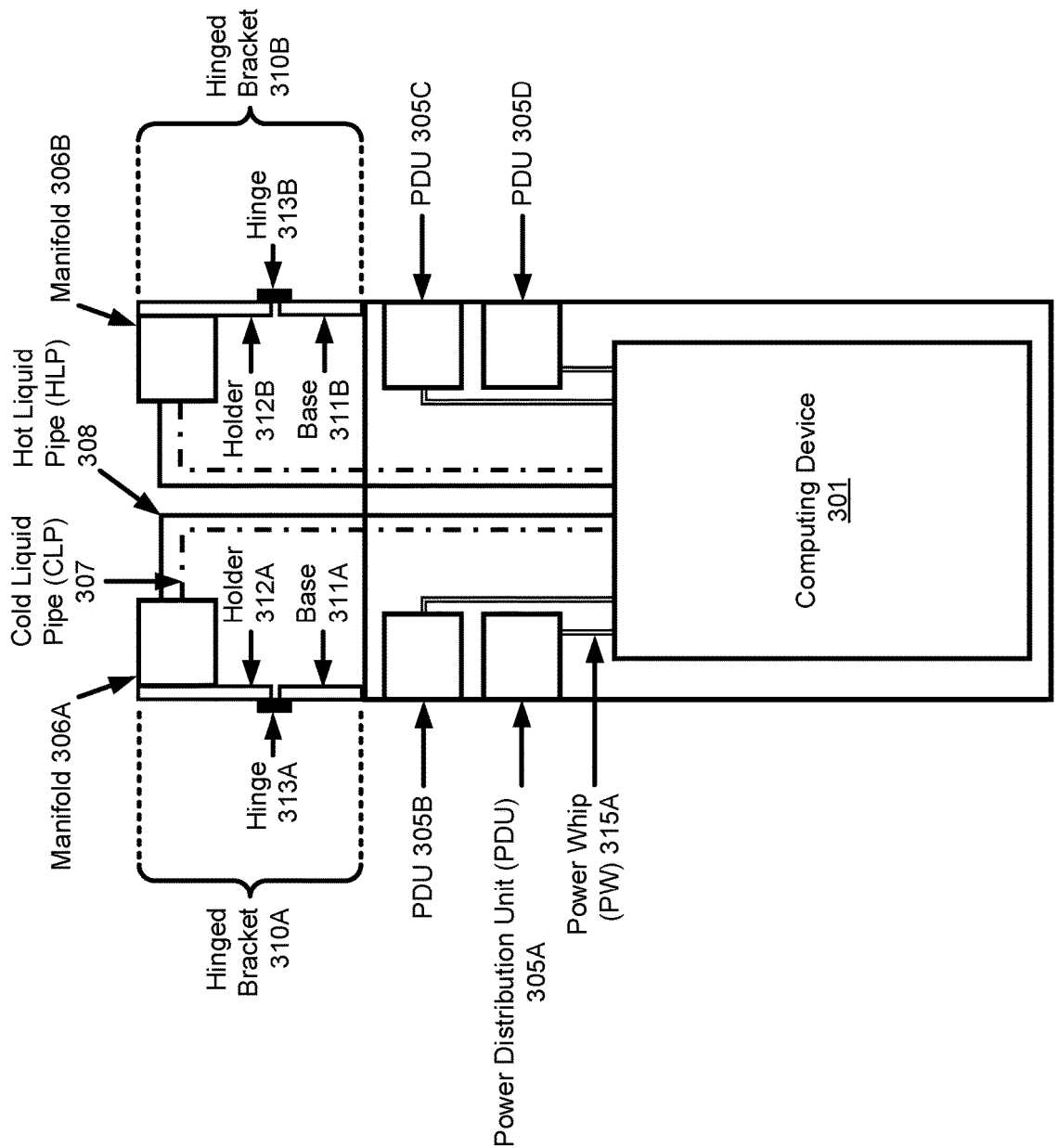
FIG. 3.1

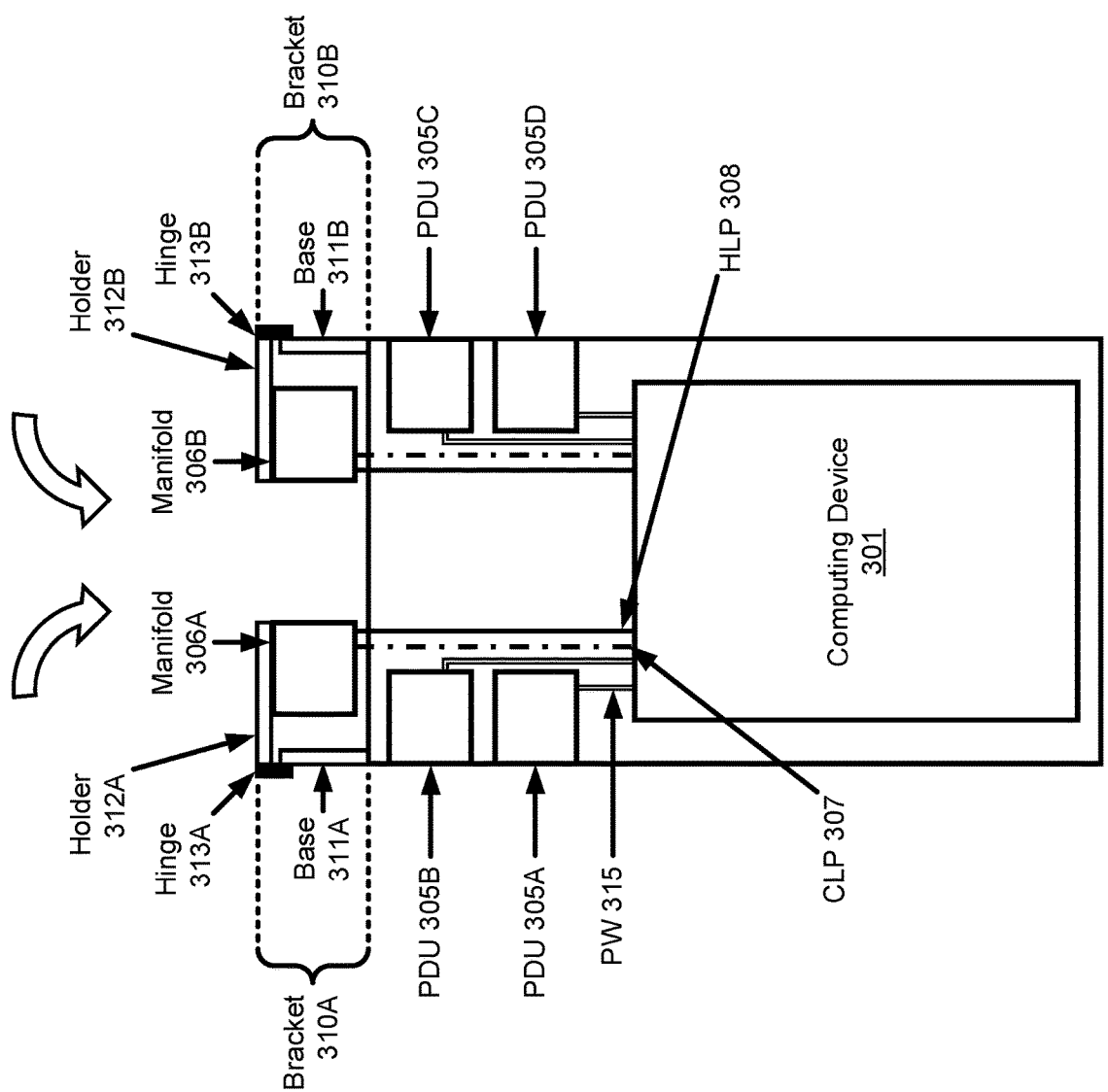
FIG. 3.2

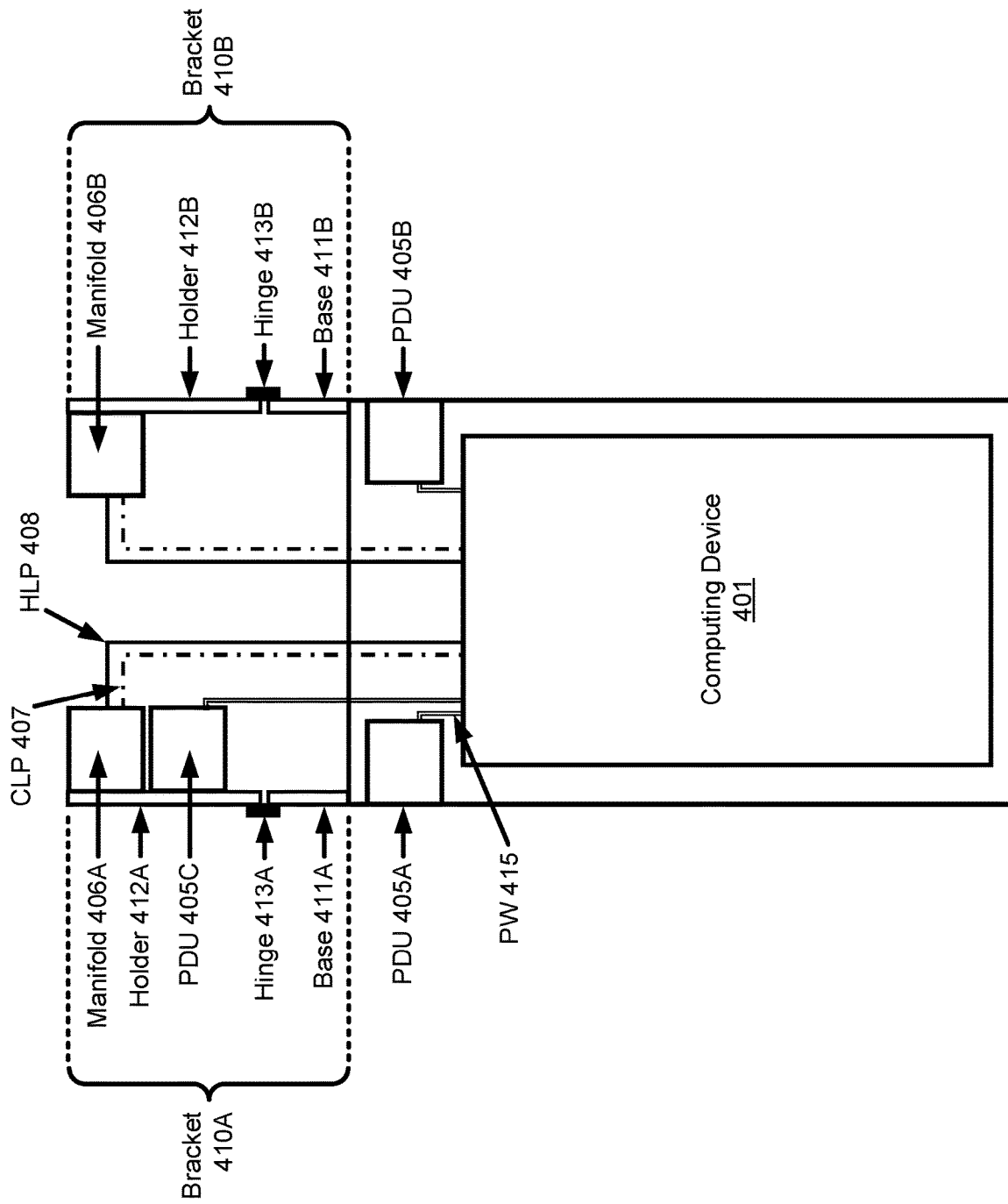
FIG. 4.1

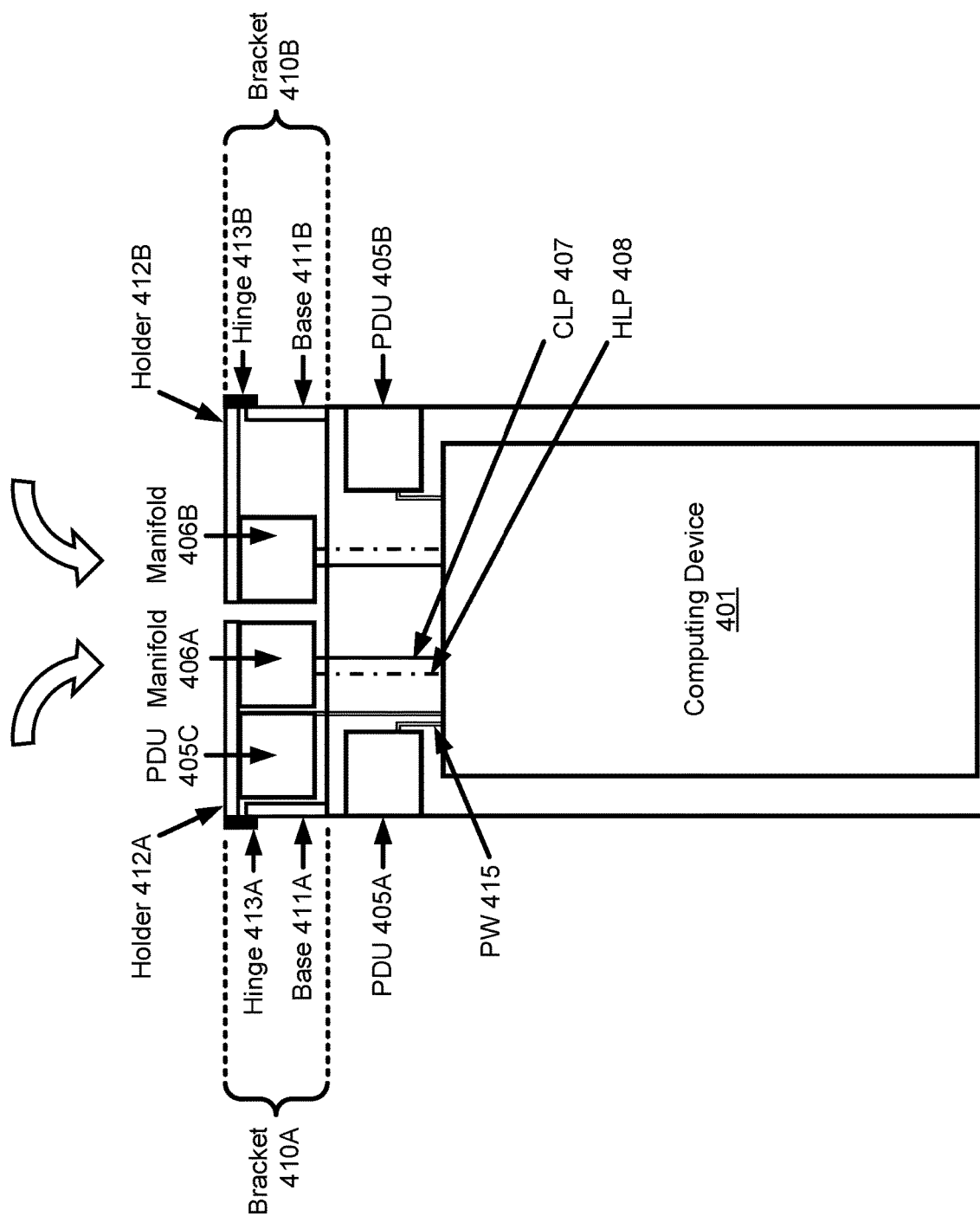
FIG. 4.2

ADJUSTABLE HINGED MOUNTING BRACKET FOR A COMPUTING DEVICE

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 2.1 shows a top view of the system of FIG. 1 in accordance with one or more embodiments of the invention.

FIG. 2.2 shows a diagram of an information handling system (IHS) in accordance with one or more embodiments of the invention.

FIG. 2.3 shows a diagram of a computing device in accordance with one or more embodiments of the invention.

FIGS. 3.1 and 3.2 show top views of an IHS in accordance with one or more embodiments of the invention.

FIGS. 4.1 and 4.2 show top views of an IHS in accordance with one or more embodiments of the invention.

DETAILED DESCRIPTION

Figure 1:
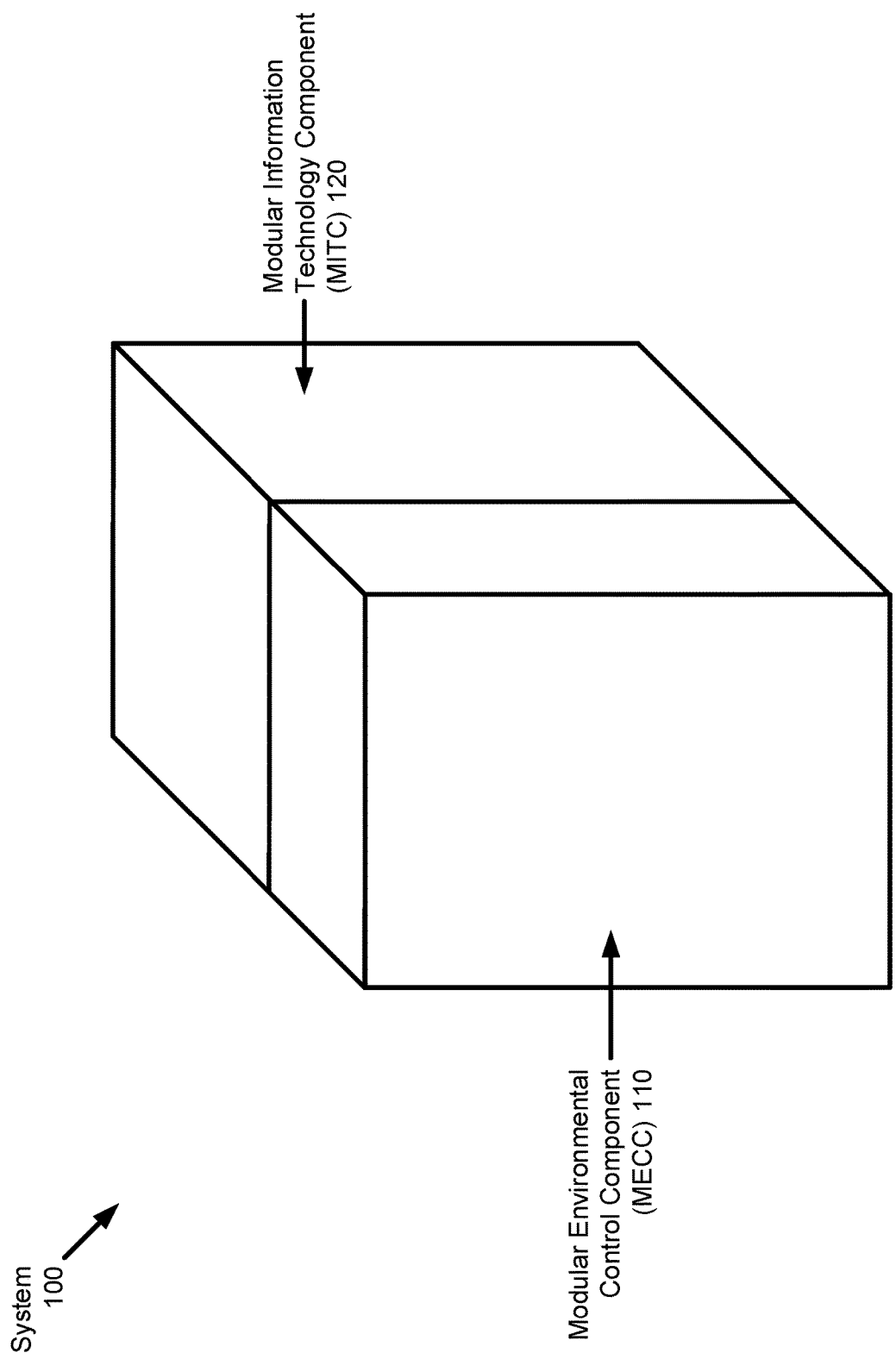
FIG. 1 shows a diagram of a system in accordance with one or more embodiments of the invention.

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, a direct liquid cooling (DLC)-assisted IHS includes one or more DLC manifolds and power distribution units (PDU) at a rear side of the IHS. Typically, in order to meet high performance computing (HPC) requirements (e.g., having a low-latency, high bandwidth communication between processors, an ability to process large amount of data at high speeds and in a short period of time, etc.), power and cooling capacities of the IHS may need to be increased. The power capacity of the IHS may be increased by mounting additional PDUs to the rear side of the IHS; however mounting additional PDUs leaves no space at the rear side of the IHS to mount additional DLC manifolds and generates cable management related issues (e.g., power cable and liquid line congestion, poor user experience, poor serviceability, etc.) at the rear side of the IHS.

To address one or more of the aforementioned issues, embodiments of the invention provide an adjustable hinged mounting bracket to host the additional PDUs and/or DLC manifolds, and to prevent cable management related issues at the rear side of the IHS. More specifically, embodiments of the invention describe how to prevent cable management related issues at the rear side of the IHS and how to provide an extension to the IHS using the adjustable hinged mounting bracket. This advantageously provides an ability to mount multiple PDUs and/or DLC manifolds (or other components) to the IHS without worrying about the cable management related issues and about the available space at the rear side of the IHS.

The following describes various embodiments of the invention.

As used herein, an "MDC" includes any facility or a portion of a facility in which computing operations are carried out. An MDC may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Turning now to FIG. 1, FIG. 1 shows a diagram of a system (100) in accordance with one or more embodiments of the invention. The system (100) includes a modular information technology component (MITC) (120) and a modular environmental control component (MECC) (110). The system (100) may include additional, fewer, and/or different components (e.g., modular building blocks) without departing from the scope of the invention. Each component illustrated in FIG. 1 is described below in reference to FIG. 2.1.

Turning now to FIG. 2.1, FIG. 2.1 shows a top view of the system of FIG. 1 in accordance with one or more embodiments of the invention. In an embodiment of the invention shown in FIG. 2.1, the MITC (220) may be a mechanical structure that enables one or more IHSs (230A, 230B), a utility control component (UCC) (240), and one or more cooling distribution units (CDUs) (not shown) to be disposed within the MITC (220).

In one or more embodiments, while disposing, the IHSs (230A, 230B) and the CDUs may be affixed to a floor (not shown) within the MITC (220) via standard mechanical mechanisms (e.g., bolts, screws, nuts, studs, etc.). In one or more embodiments, the floor is affixed to a bottom side of the MITC (220). Other mechanical or non-mechanical (e.g., glue, an adhesive tape, etc.) mechanisms for affixing the IHSs (230A, 230B) and the CDUs to the floor may be used without departing from the scope of the invention. Additional details of the CDUs are described below in reference to FIGS. 3.1-4.2.

In one or more embodiments, a white space within the MITC (220), where the IHSs (230A, 230B) are located, may have a functionality to host different types of standard racks (e.g., 4×750 millimeter (mm) wide racks, 5×600 mm wide racks, 5×48 rack unit (RU) racks, etc.) and standard CDUs (e.g., 20×10 RU CDUs, 10×20 RU CDUs, etc.). As a unit of measurement, the RU is equal to 1.75 inches and the RU defines an increment within a standard rack. The white space may also have a functionality to host custom designed racks and CDUs. Both standard (e.g., off-the-shelf) and custom designed racks and CDUs may be pre-integrated into the floor before transportation to the customer site (e.g., a customer location, a customer facility, etc.).

In one or more embodiments, apart from hosting the IHSs (230A, 230B), the white space may also host other components, for example (but not limited to): immersion tanks, uninterruptible power supplies (UPSs), battery racks, cable management towers, etc.

The aforementioned example is not intended to limit the scope of the invention.

In one or more embodiments, the MITC (220) may be implemented as other types of structures adapted to host, position, orient, and/or otherwise physically, mechanically, electrically, and/or thermally manage the IHSs (230A, 230B), the UCC (240), and the CDUs. In this manner, the MITC (220) may enable the IHSs (230A, 230B), the UCC (240), and the CDUs to be densely packed without negatively impacting the operation of the IHSs (230A, 230B), the UCC (240), and the CDUs.

In one or more embodiments, an IHS (e.g., 230A) may include a rack and any number of computing devices. Additional details of the IHS are described below in reference to FIGS. 2.2 and 2.3.

In one or more embodiments, the UCC (240) is integrated within the MITC (220) to support different types of IHSs, in which the UCC-integrated MITC is manufactured as a monolithic system. This implies that the UCC (240) is not a separate, standalone component.

In one or more embodiments, the UCC (240) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (240) may include an environmental control component (ECC) control panel (not shown) that is configured to manage a temperature within the system (e.g., 100, FIG. 1) and to provide heating and/or cooling control services. The heating and/or cooling control services may include, for example (but not limited to): (i) obtaining information relating to a temperature of one or more components within the system (e.g., 100, FIG. 1), where the information may be obtained through a number of temperature sensors (discussed below) within the system (e.g., 100, FIG. 1), (ii) determining whether the temperature within the system (e.g., 100, FIG. 1) is below or above an appropriate operating temperature level (e.g., above 0° C.), (iii) initiating, based on the determination in (ii), a heating process (e.g., activating a heater component within a MECC (210)) to bring the IHSs (230A, 230B) into their designed operating temperature levels, (iv) initiating, based on the determination in (ii), a cooling process (e.g., activating a fluid mixture unit within the MECC (210)) to bring the IHSs (230A, 230B) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, an IHS (e.g., 230A) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components (e.g., IHSs (230A, 230B)) within the system (e.g., 100, FIG. 1) to detect a temperature within the system (e.g., 100, FIG. 1). The other end of the temperature sensor may be operatively connected to the ECC control panel, in which the ECC control panel is configured to manage the components based on the temperature within the system (e.g., 100, FIG. 1).

In one or more embodiments, the UCC (240) may include a power distribution control unit (not shown) that is configured to determine which component(s) within the system (e.g., 100, FIG. 1) receive power from a modular power supply component (not shown). For example, when the heater component needs to be activated, the modular power supply component may be instructed (e.g., by the power distribution control unit) to distribute power to the heater component. As yet another example, the modular power supply component may be instructed to distribute power to the IHSs (230A, 230B).

In one or more embodiments, the modular power supply component may be designed by considering geographic factors of the customer site and custom requirements of the customer. The factors and the requirements may include, for example (but not limited to): a hurricane rating of a location, a required number of UPSs to support an operation, a required number of physical devices in a MECC, a required resiliency of a MECC, a required input power frequency, a required input voltage, etc.

The aforementioned examples are not intended to limit the scope of the invention.

In one or more embodiments, the modular power supply component may obtain customer facility's power (which comes from a centralized power station) and then may distribute the power (i.e., provide the power) to one or more components of the system (e.g., 100, FIG. 1).

In one or more embodiments, the modular power supply component may provide DC power to the components. The modular power supply component may include functionality to convert AC power (obtained from the centralized power station) to DC power.

In one or more embodiments, the modular power supply component may provide "N" or "2×N" power supply resiliency. In one or more embodiments, "N" resiliency may refer to having an exact number of components to operate. For example, if the system (e.g., 100, FIG. 1) needs "N" components to operate and if the system (e.g., 100, FIG. 1) has "N" components, this means that the system (e.g., 100, FIG. 1) has "N" resiliency. As yet another example, if the system (e.g., 100, FIG. 1) has "2×N" power supply resiliency, this means that the modular power supply component has a functionality to provide twice the amount of power needed for the system (e.g., 100, FIG. 1).

Further, if the modular power supply component provides a single power supply feed, then the system (e.g., 100, FIG. 1) will have a low level of resiliency. If there is an additional power supply feed (e.g., a separate busway), then the system (e.g., 100, FIG. 1) will have a high level of resiliency. Having an additional power capacity (e.g., having a redundant UPS, having a redundant battery, etc.) may ensure that the system (e.g., 100, FIG. 1) has no downtime while performing a service maintenance or experiencing a failure (e.g., a hardware failure, a software failure, etc.).

In one or more embodiments, apart from the modular power supply component, the power distribution control unit may include one or more backup power resources (e.g., batteries) to support an uninterrupted service (e.g., a temperature detection service, a power distribution management service, etc.) of the UCC (240).

In one or more embodiments, the UCC (240) may also include an access control unit (not shown) that is configured to control one or more security devices that are placed at various locations on the system (e.g., 100, FIG. 1). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by access doors (ADs, discussed below) (258A-258C).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (240) and/or to use the existing security system for access control.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

Those skilled in the art will appreciate that while the IHSs (230A, 230B) and the UCC (240) are shown as located on a particular side of the MITC (220), the IHSs (230A, 230B) and the UCC (240) may be located on any other side of the MITC (220) without departing from the scope of the invention.

In one or more embodiments, the MITC (220) includes the AD (258A). Similarly, the UCC (240) includes the AD (258B). In one or more embodiments, the ADs (258A, 258B) may be walk-in doors or walk-up doors. For example, as a walk-in door, the AD (258A) may permit user access to the UCC (240). As yet another example, as a walk-in door, the AD (258B) may permit user access to an internal environment of the MITC (220).

The aforementioned examples are not intended to limit the scope of the invention.

In one or more embodiments, a walk-up door may be a mechanical "reach through" structure, in which "walk-up" refers to not being able to walk inside of, for example, the MECC (210). Said another way, the walk-up door (258C) has not enough space for a customer to step inside of the MECC (210). However, using the walk-up door (258C), the customer may access substantially a portion of an ECC (e.g., a direct expansion (DX) coil (245)) to perform a service type of event.

In one or more embodiments, the service type of event may include, for example (but not limited to): changing an actuator, changing a filter, changing a sensor, etc. In one or more embodiments, because the customer not being able to walk inside of the MECC (210), the customer may perform the event while standing outside of the MECC (210).

The aforementioned examples are not intended to limit the scope of the invention.

In one or more embodiments, a walk-in door may be a mechanical "walk through" structure, in which "walk-in" refers to being able to walk inside of, for example, the MECC (210) to perform at least a service type of event. In one or more embodiments, the walk-in door has a greater depth than the walk-up door. Said another way, the walk-in door has enough space (e.g., a walk-in space) for a customer to step inside of the walk-in door.

In one or more embodiments, for example, the AD (258A) includes a handle (not shown) that makes easier to open or close the AD (258A) to walk through or reach through the internal environment of the MITC (220). In this manner, the customer may perform a service type of event without standing outside of the MITC (220).

The aforementioned example is not intended to limit the scope of the invention.

In one or more embodiments, the ADs (258A-258C) may be wicket doors (e.g., a door in a door), in which the ADs (258A-258C) both include a person door and a rack door.

This means that the ADs (258A-258C) are big enough to pass a rack (not shown) through the ADs (258A-258C). In one or more embodiments, dotted arcs show an inward rotation or an outward rotation of the ADs (258A-258C).

Those skilled in the art will appreciate that while the ADs (258A, 258B) are shown as located on a rear side of the MITC (220) and a front side of the UCC (240), respectively, the ADs (258A, 258B) may be located on any other side of the MITC (220) and the UCC (240) without departing from the scope of the invention.

In one or more embodiments, the MITC (220) includes a connection interface, in which the connection interface is affixed to a pairing end of the MITC (220). The pairing end of the MITC (220) refers to a portion of the MITC (220) that can be paired with another component (e.g., the MECC (210)). In one or more embodiments, the connection interface of the MITC (220) includes mechanical and electrical connection components (MECCOMs) (250B). The connection interface of the MITC (220) also includes built-in airflow connection components.

In one or more embodiments, the mechanical connection components keep the MECC (210) connected to the MITC (220). The mechanical connection components also provide structural support to the MECC (210) and to the MITC (220) in case of a seismic event. The mechanical connection components may be, for example (but not limited to): steel plates with bolted connections, mechanical hard-stop components, sealing components, etc.

In one or more embodiments, "connected" may refer to "directly connected", in which there is a seal in between, for example, the connection interface of the MITC (220) and a connection interface of the MECC (210) (discussed below).

Alternatively, "connected" may refer to "connected via one or more physical components in between". For example, the connection interface of the MITC (220) is connected to the connection interface of the MECC (210), in which at least one physical component is mechanically touching the connection interfaces.

In one or more embodiments, the electrical connection components may transmit or receive power and data (e.g., temperature data, humidity data, etc.) to or from the MECC (210). For example, the UCC (240) may collect a temperature of one or more components within the MITC (220) as temperature data. Based on the collected data, the UCC (240) may activate or deactivate the MECC (210) using the electrical connection components.

In one or more embodiments, the airflow connection components may be ducting components that allow using either standard or custom designed MECCs. The airflow connection components may change (e.g., twist) a direction of an airflow formed between the MECC (210) and the MITC (220). For example, the MECC (210) may include a cold air ducting component and a hot air ducting component. The cold air ducting component may supply cold air into the MITC (220). The hot air ducting component may remove hot air from the MITC (220) and may deliver the hot air to the MECC (210).

The aforementioned examples are not intended to limit the scope of the invention.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section, or a cross-section that changes over the length of the passageway.

In one or more embodiments, an area (e.g., height×width) enclosed by the connection interface of the MITC (220) is equal to an area enclosed by the connection interface of the MECC (210). In this manner, an end-to-end pairing between the MITC (220) and the MECC (210) may be installed for compatible mechanical, electrical, and airflow connections.

The MECC (210) may include one or more physical devices (e.g., ECCs) that alter characteristics (e.g., airflow directions, humidity of air, and temperature levels, etc.) of the internal environment of the MITC (220) at a macroscopic level. The physical devices may also ensure reliability of the IHSs (230A, 230B) and the UCC (240). In one or more embodiments, the physical devices may be affixed to a floor (e.g., a bottom side) of the MECC (210). In one or more embodiments, a physical device may be, for example (but not limited to): a fan (255), a DX coil (245), a fluid mixture unit, a heater component, an immersion cooling component, etc.

The aforementioned example is not intended to limit the scope of the invention.

In some cases, the system (e.g., 100, FIG. 1) may be deployed to environments that result in the temperature levels of the IHSs (230A, 230B) and the UCC (240) being outside of their designed operating temperature levels. For example, the IHSs (230A, 230B) may be designed to operate at temperature levels above 0° C. When the system (e.g., 100, FIG. 1) is deployed to an environment with harsh conditions (e.g., −40° C.-60° C.), the IHS (230A, 230B) may not operate properly and, in certain scenarios, may be damaged. To prevent the aforementioned issue, depending on environmental conditions, the physical devices either cool or heat the internal environment of the MITC (220). In this manner, stability and functionality of the IHSs (230A, 230B) and the UCC (240) may be preserved.

In one or more embodiments, as a gas mover, the fan (255) may be able to change a rate of gases being taken into and expelled from the IHSs (230A, 230B) and the UCC (240). As a refrigerant-based cooling technology, the DX coil (245) may cool the internal environment of the MITC (220) using a condensed refrigerant liquid (e.g., liquid nitrogen, hydrofluorocarbons (HFCs), etc.). In this technology, the refrigerant may expand to generate a cooling effect in the DX coil (245) that is in direct contact with a conditioned air, which will be supplied to the internal environment of the MITC (220).

In one or more embodiments, as a liquid cooling component, the fluid mixture unit may pump cooled fluid mixture (e.g., a mixture of water and glycerol) throughout hardware components (not shown) of the IHSs (230A, 230B) and the UCC (240). An absorbed air by the fluid mixture may then be transferred to an external environment of the MITC (220). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the MECC (210) may also take advantage of a cooling infrastructure that is already built-in at a customer site. For example, the MECC (210) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHSs (230A, 230B) and the UCC (240) into their appropriate operating temperature levels (e.g., above 0° C.) when necessary. To initiate a heating process, the heater component may obtain a required power from the modular power supply component. The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the MITC (220). In one or more embodiments, a number of heat sinks (not shown) may be used to provide a uniform distribution of heated volume of air drawn into the internal environment of the MITC (220) through their fins, in which a bottom portion of the number of heat sinks is affixed to the heater component. In this manner, a surface area of the heater component may be expanded indirectly to increase an efficiency of the heater component.

In one or more embodiments, the MECC (210) may provide "N+1" or "N+2" heating and/or cooling resiliency. In one or more embodiments, "N+1" cooling resiliency may indicate that even if one of the physical devices is deactivated (because of a service maintenance), the IHSs (230A, 230B) may still operate. For example, the MECC (210) has four fans and the MECC (210) has "N+1" resiliency. In this case, the required number of fans to support operation of the IHSs (230A, 230B) is three and the MECC (210) has a redundant fan. Having additional heating and/or cooling capacity (e.g., having a redundant fan, having a redundant heater component, etc.) may ensure that the IHSs (230A, 230B) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the MECC (210) is on average 1.01 (e.g., 99% efficiency)-1.043 (e.g., 95% efficiency), depending on where the system (e.g., 100, FIG. 1) is deployed. For example, if the system (e.g., 100, FIG. 1) is deployed to a hot environment (e.g., Phoenix, AZ), the PUE value of the MECC (210) may be 1.043. As yet another example, if the system (e.g., 100, FIG. 1) is deployed to a mild (e.g., neither hot nor cold) environment (e.g. San Diego, CA), the PUE value of the MECC (210) may be 1.01.

The aforementioned example is not intended to limit the scope of the invention.

In one or more embodiments, the MECC (210) supplies cold air (shown with a dashed line arrow) to the internal environment of the MITC (220) (including the UCC (240)) via the built-in airflow connection components. The MECC (210) also removes hot air (shown with a solid line arrow) from the internal environment of the MITC (220) (including the UCC (240)) via the built-in airflow connection components. In one or more embodiments, the dashed line and the solid line arrows inside of the MITC (220) may be referred to as a "cold aisle" and a "hot aisle", respectively.

The cold aisle may refer to an area (e.g., a space) in which conditioned (e.g., cold) air is introduced to a front side of the IHSs (230A, 230B) and to the UCC (240) to remove heat. The cold air may also be introduced to other components located within the internal environment of the MITC (220) without departing from the scope of the invention.

The hot aisle may refer to an area in which conditioned (e.g., hot) air is removed from a rear side of the IHSs (230A, 230B) and from the UCC (240) for the reliability of the IHSs (230A, 230B) and the UCC (240). The hot air may also be removed from other components located within the internal environment of the MITC (220) without departing from the scope of the invention.

In one or more embodiments, similar to MITC (220), the MECC (210) includes the AD (258C). In one or more embodiments, the AD (258C) may be a walk-in door or a walk-up door (as discussed above). For example, as a walk-in door, the AD (258C) may permit user access to the MECC (210).

The aforementioned example is not intended to limit the scope of the invention.

Those skilled in the art will appreciate that while the AD (258C) is shown as located on a right side of the MECC (210), the AD (258C) may be located on any other side of the MECC (210) without departing from the scope of the invention.

In one or more embodiments, as being separate components and as having separate ADs, once paired, the MITC (220) and the MECC (210) provide an additional security measure to the user access. For example, user 1 has access to the AD (258C) and user 2 has access to the ADs (258A-258C). In this case, because user 2 has access to all ADs, user 2 can access to the UCC (240), the MITC (220), and the MECC (210). However, because user 1 has access only to the AD (258C), user 1 cannot access to the UCC (240) and to the MITC (220).

The aforementioned example is not intended to limit the scope of the invention.

In one or more embodiments, similar to the MITC (220), the MECC (210) includes a connection interface, in which the connection interface is affixed to a pairing end of the MECC (210). The pairing end of the MECC (210) refers to a portion of the MECC (210) that can be paired with another component (e.g., the MITC (220)). In one or more embodiments, similar to the MITC (220), the connection interface of the MECC (210) includes MECCOMs (250A). The connection interface of the MECC (210) also includes the built-in airflow connection components.

In one or more embodiments, the MITC (220) and the MECC (210) are oriented in a same direction. Further, a double-headed arrow shows modularity of the system (e.g., 100, FIG. 1), in which the MECC (210) may be attached to, or detached from the MITC (220) along the same direction.

Those skilled in the art will appreciate that while the IHSs (230A, 230B) are oriented in parallel to the MECCOMs (250B), the IHSs (230A, 230B) may be oriented in any direction without departing from the scope of the invention.

In one or more embodiments, the end-to-end and medium form factor (e.g., medium shape) of the MDC (the system (e.g., 100, FIG. 1)) described in FIGS. 1 and 2.1 makes the system (e.g., 100, FIG. 1) deployable to, for example (but not limited to): space-unlimited locations, remote locations, etc. The space-unlimited locations may be, for example (but not limited to): university campuses, research and development locations, etc. The remote locations (e.g., edge locations) may be locations that are away from specialized IT and security personnel to maintain an operation of the MDC.

Providing multiple functionalities and fitting these functionalities into the medium form factor make formation, deployment, and operation of the end-to-end MDC easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (210) and the MITC (220) enables a variety of cooling technologies, capacities, and resiliencies to be paired with a variety of power capacities, resiliencies, and IHS technologies.

Turning now to FIG. 2.2, FIG. 2.2 shows a diagram of the IHS (230A) in accordance with one or more embodiments of the invention. The IHS (230A) may include a rack (260) and any number of computing devices (e.g., 270).

In one or more embodiments, the rack (260) may be a mechanical structure that enables the computing devices to be positioned with respect to one another. For example, the rack (260) may be a mountable enclosure that enables the computing devices to be disposed within the rack (260). The rack (260) may be implemented as other types of structures adapted to host, position, orient, and/or otherwise physically, mechanically, electrically, and/or thermally manage the computing devices. By managing the computing devices, the rack (260) may enable the computing devices to be densely packed in a space without negatively impacting the operation of the IHS (230A).

In one or more embodiments, a computing device (e.g., 270) may be a mechanical structure for housing components of the IHS (230A). For example, the computing device (e.g., 270) may be implemented as a rack-mountable enclosure for housing components of the IHS (230A). The computing device (e.g., 270) may be adapted to be disposed within the rack (260) and/or utilize services provided by the rack (260) and/or other components available in the system (e.g., 100, FIG. 1).

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention.

In one or more embodiments, a set of isolators (not shown) may be attached to the components (e.g., the IHSs (e.g., 230A, 230B, FIG. 2.1), the floor, the CDUs, etc.) of the system (e.g., 100, FIG. 1) to make sure that the components are ready-to-use when they deployed to the customer site. In one or more embodiments, the set of isolators provides a shock isolation to the components such that the components may be protected from any damage (e.g., a vibrational damage).

Turning now to FIG. 2.3, FIG. 2.3 shows a diagram of the computing device (270) in accordance with one or more embodiments of the invention. In one or more embodiments, the computing device (270) includes six sides (i.e., top, bottom, right, left, front, and rear), in which air drawn into from a front side of the computing device (e.g., via an air inlet (280)) and expelled from the rear side of the computing device (e.g., via one or more ECCs). An airflow direction is shown with a dashed line arrow (cold air) and a solid line arrow (hot air). In general, air incoming from the front side of the computing device (270) is cooler than air outgoing from the rear side of the computing device (270).

In one or more embodiments, to provide services, the computing device (270) may utilize resources provided by a number of hardware components hosted within the computing device (270). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (270).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention.

In one or more embodiments, the medium form factor of the system described in FIG. 2.1 may increase a PUE value of the computing device (270). For example, because the system described in FIG. 2.1 includes a separate cooling and/or heating unit (210), the computing device (270) may not have a fan and/or a heating component. In this manner, the computing device (270) may become more power dense and power-efficient.

FIGS. 3.1 and 3.2 show top views of an IHS in accordance with one or more embodiments of the invention. Comparing to the IHS shown in FIGS. 4.1 and 4.2, the IHS shown in FIGS. 3.1 and 3.2 has different structural characteristics, for example (but not limited to): a different size computing device, a different number of PDUs, a different number of DLC manifolds, etc.

The aforementioned example is not intended to limit the scope of the invention.

Turning now to FIG. 3.1, FIG. 3.1 shows a top view of a portion of an IHS (e.g., 230A, FIG. 2.2) in accordance with one or more embodiments of the invention. In an embodiment of the invention shown in FIG. 3.1, the embodiment includes a computing device (301), one or more PDUs (305A-305D), a first hinged bracket (310A), a second hinged bracket (310B), and one or more DLC manifolds (306A, 306B). The computing device (301) may be the same as the computing device (270) as discussed above in reference to FIG. 2.3. Each component illustrated in FIG. 3.1 is described below.

In one or more embodiments, a "PDU" is a component with multiple outlets designed to distribute (e.g., to transfer) power, from a power source (e.g., a modular power supply component), to components disposed within a rack of the IHS. In one or more embodiments, the components may be, for example (but not limited to): computing devices, network switches, storage devices, etc. To compare, for example, a UPS provides battery backup to a network switch during power outages. A UPS also filters incoming power to the network switch and provides a surge protection. However, a PDU distributes power from a UPS (or from a different type of power supply component) to the network switch, which means the PDU does not generate or condition power on its own.

The aforementioned example is not intended to limit the scope of the invention.

To distribute power and/or to enhance remote power management in various structural conditions, the PDUs (305A-305D) may be manufactured in a variety of styles, for example (but not limited to): a local metered PDU, a monitored PDU, a switchable PDU, a hot-swap PDU, a network switch added PDU, etc. In one or more embodiments, the various structural conditions may include, for example (but not limited to): a type of a rack, a required input power to feed a component within a rack, a plug type of a component, etc.

In many cases, the rack may be configured with multiple PDUs (e.g., 305A-305D) for various reasons, for example (but not limited to): power redundancy, power sharing, power cable management, etc.

The aforementioned examples are not intended to limit the scope of the invention.

In one or more embodiments, the PDUs (305A-305D) may distribute power to the components disposed within the rack via power cables (power whips (e.g., 315A, shown with a double solid line)). In order to distribute, the PDUs (305A-305D) may receive power from one or more busway plugs (not shown) and from one or more busways (not shown) disposed within the MITC (e.g., 220, FIG. 2.1).

As used herein, a "cable" includes any cable, conduit, or line that carries one or more conductors and that is flexible over at least a portion of its length. A cable may include a connector portion, such as a plug, at one or more of its ends.

In one or more embodiments, a "busway plug" is a premanufactured, movable component that plugs into a busway (e.g., a bus duct) to provide (i) a localized power distribution and (ii) a power surge protection to the components within the MITC (e.g., 220, FIG. 2.1). To protect a component against a power surge (e.g., a power overload), a busway plug may use, for example (but not limited to): a fuse, a circuit breaker, etc.

The aforementioned example is not intended to limit the scope of the invention.

In one or more embodiments, a "busway" is a premanufactured, movable power distribution system consisting of bus bars (and other components) in a protective enclosure. A busway may transfer power and may connect to an electrical device such as a switchgear, a panelboard, and a transformer. In one or more embodiments, bus bars (e.g., aluminum or copper conductors) and other components (e.g., elbows, offsets, etc.) may help to properly route a busway to an electrical connection point or to a termination point.

As an alternative approach to provide power to a component, comparing to power cables (or power conduits), busways are not resource-intensive to install and are easier to move, particularly when load locations in a system are likely to change. To operate in different environments (e.g., data centers, laboratories, petrochemical sites, etc.), busways may be manufactured in a variety of styles, for example (but not limited to): a non-segregated busway, a sandwich-style busway, a track busway, an air-insulated busway, etc.

The aforementioned example is not intended to limit the scope of the invention.

In one or more embodiments, similar to the computing device (e.g., 270, FIG. 2.3), the rack includes six sides, in which the first hinged bracket (310A) is affixed to the rear side of the rack. While affixing, standard mechanical mechanisms may be used to affix the first hinged bracket (310A) to the rear side of the rack. Other mechanical or non-mechanical mechanisms for affixing the first hinged bracket (310A) to the rear side of the rack may be used without departing from the scope of the invention.

In one or more embodiments, the first hinged bracket (310A) includes a first base (311A), a first holder (312A), and a first hinge (313A). In one or more embodiments, the first base (311A) includes two portions (e.g., a first portion and a second portion), in which a first portion of the first base (311A) refers to a portion of the first base (311A) that is affixed (e.g., welded, connected, etc.) to the rear side of the rack. A second portion of the first base (311A) refers to a portion of the first base (311A) that is affixed to a first portion of the first hinge (313A) (discussed below).

In one or more embodiments, as being a mechanical support component, the first base (311A) may provide structural support to the first hinge (313A) and to the first holder (312A) in case of a seismic event. The first base (311A) may also provide structural support to the first hinge (313A) to keep the first hinge (313A) connected to the first base (311A).

In one or more embodiments, standard mechanical mechanisms may be used to affix the first portion of the first base (311A) to the rear side of the rack. Similarly, standard mechanical mechanisms may be used to affix the second portion of the first base (311A) to the first portion of the first hinge (313A). Other mechanical or non-mechanical mechanisms for affixing (i) the first portion of the first base (311A) to the rear side of the rack and (ii) the second portion of the first base (311A) to the first portion of the first hinge (313A) may be used without departing from the scope of the invention.

In one or more embodiments, similar to the first base (311A), the first hinge (313A) includes two portions, in which a first portion of the first hinge (313A) refers to a portion of the first hinge (313A) that is affixed to the second portion of the first base (311A). A second portion of the first hinge (313A) refers to a portion of the first hinge (313A) that is affixed to a first portion of the first holder (313A) (discussed below).

In one or more embodiments, as being a mechanical support component, the first hinge (313A) may provide structural support to the first holder (312A) and to the first base (311A) in case of a seismic event. The first hinge (313A) may also provide structural support to the first holder (312A) to keep the first holder (312A) connected to the first hinge (313A). Further, the first hinge (313A) may provide one or more functionalities to the first holder (312A), as discussed below.

In one or more embodiments, standard mechanical mechanisms may be used to affix the first portion of the first hinge (313A) to the second portion of the first base (311A). Similarly, standard mechanical mechanisms may be used to affix the second portion of the first hinge (313A) to the first portion of the first holder (312A). Other mechanical or non-mechanical mechanisms for affixing (i) the first portion of the first hinge (313A) to the second portion of the first base (311A) and (ii) the second portion of the first hinge (313A) to the first portion of the first holder (312A) may be used without departing from the scope of the invention.

In one or more embodiments, similar to the first base (311A), the first holder (312A) includes two portions, in which a first portion of the first holder (312A) refers to a portion of the first holder (312A) that is affixed to the second portion of the first hinge (313A). A second portion of the first holder (312A) refers to a portion of the first holder (312A) that is connected to one or more information technology components (ITCs), in which the second portion of the first holder (312A) hosts the ITCs. Said another way, the second portion of the first holder (312A) is configured to host the ITCs for a better power and/or cooling distribution, control, or communication.

With an ability to mount an ITC outside of the rack and with an ability to rotate the first holder (312A) about the first hinge (313A) (discussed below), a customer may mount one or more ITCs to the second portion of the first holder (312A) to increase power capacity and/or cooling capacity of the IHS to perform HPC tasks. In this manner, for example, (i) the customer may perform HPC tasks without worrying about the available space within the IHS, (ii) the customer may have a better cable (and/or liquid line) management at the rear side of the IHS, and (iii) the customer may have a better user experience and a better serviceability when removing or deploying a component (e.g., a computing device, a PDU, etc.) from or to the rack.

The aforementioned example is not intended to limit the scope of the invention.

In one or more embodiments, the ITC may be, for example (but not limited to): a DLC manifold, a PDU, etc. Further, as being a mechanical support component, the first holder (312A) may provide structural support to the ITCs (e.g., 306A) in case of a seismic event. The first holder (312A) may also provide structural support to the ITCs (e.g., 306A) to keep the ITCs (e.g., 306A) connected to the first holder (e.g., 306A).

In one or more embodiments, standard mechanical mechanisms may be used to mount the ITCs (e.g., 306A) to the second portion of the first holder (312A). Other mechanical or non-mechanical mechanisms for mounting the ITCs (e.g., 306A) to the second portion of the first holder (312A) may be used without departing from the scope of the invention.

In one or more embodiments, the first holder (312A) is a movable (e.g., rotatable) component to provide an extension to the rack and to provide an extra space (together with the first base (311A)) at the rear side of the rack. Said another way, as shown in FIG. 3.1, the first hinged bracket (310A) extends the rear side of the rack (i) to host ITCs and (ii) to provide a better user experience and a better serviceability.

In one or more embodiments, the first holder (312A) is supported by the first hinge (313A) for rotation about a finite rotation angle relative to the static (e.g., fixed) first base (311A), in which the first hinge (313A) may limit rotation of the first holder (312A) when the first holder (312A) is in an "engaged position" (discussed below). In one or more embodiments, the first holder (312A) may be in a "disengaged position" (as shown in FIG. 3.1), spaced apart from the first base (311A), or may be in an engaged position (see FIG. 3.2), proximate to the first base (311A). The first hinge (313A) is connected to both the first base (311A) and the first holder (312A) to displace (e.g., to rotate) the first holder (312A) between a disengaged position and the engaged position, for example, to remove the computing device (301) from the rack.

The aforementioned example is not intended to limit the scope of the invention.

Those skilled in the art will appreciate that while the first holder (312A) is shown as being fixed to a particular disengaged position, the first holder (312A) may be fixed to any other disengaged position (within the rotation angle and while still providing the same functionalities) without departing from the scope of the invention.

In one or more embodiments, as described above, the first holder (312A) is rotatable within a finite rotation angle; however, the first hinge (313A) may act as a mechanical hard-stop component to prevent the first holder (312A) from rotating beyond the rotation angle. For example, after rotating inward (see the arrow in FIG. 3.2) about the first hinge (313A), the first holder (312A) may be fixed to the engaged position before getting closer to the rear side of the rack. As yet another example, after rotating outward about the first hinge (313A), the first holder (312A) may be fixed to a disengaged position before getting closer to the left side of the rack. Further, the first hinge (313A) may limit (e.g., impede) the rotation of the first holder (312A) relative to the first base (311A) to prevent any damage on cables and/or liquid lines that could otherwise occur from rotation of the first holder (312A).

The aforementioned example is not intended to limit the scope of the invention.

In one or more embodiments, the first holder (312A) and the ITCs are oriented in a first direction and after rotating inward or outward about the first hinge (313A), the first holder (312A) and the ITCs are oriented in a second direction, in which the first direction and the second direction are different. Further, the first hinge (313A) may include a solenoid to rotate the first holder (312A) between a disengaged position and the engaged position. A controller component (not shown) may be connected to the solenoid such that the controller component may rotate the first holder (312A) toward one of pre-set disengaged positions. More specifically, the controller component may be responsive to instructions recorded on a memory (of the computing device (301)) to rotate the first holder (312A) between one of the pre-set disengaged positions and the engaged position. For example, based on a received instruction, the controller component may rotate the first holder (312A) from a disengaged position (as shown in FIG. 3.1) to the engaged position (as shown in FIG. 3.2) before shipping the system (e.g., 100, FIG. 1) to the customer site. As yet another example, based on a second received instruction, the controller component may rotate the first holder (312A) from the engaged position to another disengaged position (not shown) to remove a PDU (e.g., 305B) from the rack.

The aforementioned examples are not intended to limit the scope of the invention.

In one or more embodiments, while described as a logically controlled component, the first holder (312A) may be operated manually by a customer. For example, a customer may physically rotate the first holder (312A) by pushing the first holder (312A) from a disengaged position to the engaged position. As yet another example, the customer may physically rotate the first holder (312A) by pushing the first holder (312A) from the engaged position to a disengaged position.

The aforementioned examples are not intended to limit the scope of the invention.

In one or more embodiments, for example, in order to (i) increase cooling efficiency of the MECC (e.g., 210, FIG. 2.1), (ii) reduce the amount of time of the MECC (e.g., 210, FIG. 2.1) needs to operate, (iii) reduce to dependency on the MECC (e.g., 210, FIG. 2.1), (iv) remove fans from the computing device (301), (v) reduce power usage of the computing device (301); (vi) enhance thermal management of the internal environment of the MITC (e.g., 220, FIG. 2.1), (vii) prevent damage to the hardware components of the computing device (301), and (viii) improve functionality of the hardware components of the computing devices (301), as part of an "in-row" cooling architecture, a customer may mount a DLC manifold (306A) to the first holder (312A).

The aforementioned examples are not intended to limit the scope of the invention.

In one or more embodiments, based on a row-oriented cooling architecture, the customer may disposed one or more CDUs (not shown) within the MITC (e.g., 220, FIG. 2.1), for example, to increase the cooling resiliency of the system (e.g., 100, FIG. 1) and to implement a dedicated cooling to one row of IHSs. In order to do that, the CDUs may be affixed among the IHSs (e.g., 230A, 230B, FIG. 2.1), overhead the IHSs (e.g., 230A, 230B, FIG. 2.1), inside of the IHSs (e.g., 230A, 230B, FIG. 2.1), or under the floor within the MITC (e.g., 220, FIG. 2.1). Comparing to "room-based" cooling (where cold air is pushed into an entire room rather than directly onto a hot component), in-row cooling architecture provides clearly defined airflow paths toward increasing cooling efficiency of the MECC (e.g., 210, FIG. 2.1).

In one or more embodiments, with the help of a DLC technology, a row-oriented cooling architecture allows cooling capacity and redundancy to be targeted to the actual needs of specific rows. For example, a CDU may allow one row of IHSs (e.g., blade servers) to perform high density applications, while another row of IHSs (communication enclosures) performing low power density applications. As yet another example, mission critical IHSs may reside in a row that features redundant cooling, and less critical IHSs may reside in a row without redundant cooling. Further, a row-oriented cooling architecture may be implemented without having a raised floor, which (i) increases a floor load bearing capacity, (ii) reduces installation costs, (iii) eliminates a need for access ramps, and (iv) allows data centers to exists in building that otherwise do not have headroom to permit the installation of a raised floor.

The aforementioned examples are not intended to limit the scope of the invention.

As used herein, a "row" means a number of components arranged in a line. A row may include components arranged in a straight line or may include components arranged in a curved line. For example, a row of IHSs may include multiple IHSs arranged in a line.

As used herein, a "raised floor" is a data center construction model where a slightly higher floor is constructed above a floor (e.g., a bottom side) of the data center. A raised floor allows to generate an open space between the two floors for a better (i) cold air distribution (via, for example, bottom ducting components), (ii) air containment, and (iii) cable management within the data center.

In one or more embodiments, a CDU is a component that controls and provides cooling for IHSs (e.g., 230A, 230B, FIG. 2.1). A CDU may include a pump for a secondary line, a facility valve, one or more temperature sensors, a processing component, and other components to control cooling or other various aspects of the CDU. A CDU may monitor a supply temperature of a secondary line via temperature sensors and may adjust a facility valve position based on the supply temperature of the secondary line.

In one or more embodiments, coolant (e.g., liquid, fluid, etc.) may flow through a facility line, in which the facility line may travel from a facility (e.g., a system) coolant storage area to a heat exchanger of a CDU and back to the facility coolant storage area. Coolant may also travel through the secondary line, in which the secondary line travels from the heat exchanger to the IHSs (e.g., to the DLC manifolds (306A, 306B)) and back to the heat exchanger. The heat exchanger may then transfer heat from the secondary line to the facility line.

In one or more embodiments, based on the supply temperature of the secondary line, the CDU may adjust the facility valve position. The temperature of coolant supplied to the secondary line may indicate a high or a low load on the IHSs and thus on the CDU itself. The CDU may then increase or decrease a flow rate of the coolant based on the facility valve position. In this manner, the CDU may control cooling based in part on an average differential pressure between a supply and a return for the CDU (e.g., for the secondary line), in which the CDU measures the pressure at the supply of the secondary line and at the return of the secondary line.

As used herein, "coolant" may be water, nitrogen, propylene glycol, mineral oil, refrigerant, dielectric, or some combination thereof. A line, such as the secondary line or the facility line, may carry the coolant through the CDU, the facility coolant storage area, the IHSs, or some combination thereof. The line may be a pipe or a duct.

In one or more embodiments, the purpose of a DLC manifold is to distribute liquid (from the secondary line) into different hardware components of an IHS. As shown in FIG. 3.1, the DLC manifold is a rack manifold, but the DLC manifold is not necessarily assembled together with the rack. In most cases, DLC systems require many liquid connectors, but having many liquid connectors may generate liquid leakage problems, which can be harmful or fatal to the hardware components. For this reason, liquid connectors are key components in DLC systems, and the liquid connectors substantially affect reliability of the DLC systems because they have high failure rates. In order to prevent leakage problems and in order to improve reliability of the row-oriented cooling architecture, the DLC manifolds (306A, 306B) may include a CDU manifold part and a rack manifold part. The DLC manifolds (306A, 306B) may be mounted to the hinged brackets (310A, 310B) to reduce or eliminate problems relate to shipping and handling.

In one or more embodiments, a CDU manifold part is liquidly (e.g., fluidly) coupled to a rack manifold part. The term "liquidly coupled," when applied herein to a pair of components, means that the components are coupled to each other, directly or indirectly, in such a way that a liquid can flow in them or between them in one or both directions.

In one or more embodiments, the rack manifold part of the DLC manifold (306A) includes liquid connectors (e.g., nozzles, cold liquid pipes (CLPs), hot liquid pipes (HLPs), etc.) to support DLC of the hardware components. For example, a CLP (307) (shown with a dash-dotted line) is connected to the computing device (301) to deliver cold liquid to the computing device (301) to cool off the hardware components. As yet another example, a HLP (308) (shown with a solid line) is connected to the computing device (301) to deliver heated cold liquid to the rack manifold. Further, the liquid connectors may provide blind-mating connection between the rack manifold part of the DLC manifold (306A) and the hardware components.

The aforementioned examples are not intended to limit the scope of the invention.

In one or more embodiments, the CDU manifold part of the DLC manifold (306A) includes a supply loop (not shown) having a supply inlet (not shown) and a return loop (not shown) having a return outlet (not shown). The supply inlet may be liquidly coupled to the secondary line and the return outlet may be liquidly coupled to the rack manifold part (and to the HLP (308)). As their names imply, the supply inlet supplies cold "working" liquid to the CLP (307), while the return outlet returns hot "working" liquid from the rack manifold part of the DLC manifold (306A) to the CDU. In one or more embodiments, the CDU manifold part of the DLC manifold (306A) may be liquidly connected to the CDU.

In one or more embodiments, the supply loop and the return loop may have one or more valves positioned along at least part of their lengths. For example, the supply loop may have N valves liquidly coupled to the supply loop, in which N may be any integer, e.g., one or greater. As yet another example, the return loop may have M valves liquidly coupled to the return loop, in which M may be any integer, e.g., one or greater.

The aforementioned examples are not intended to limit the scope of the invention.

In one or more embodiments, similar to the first hinged bracket (310A), the second hinged bracket (310B) is affixed to the rear side of the rack. While affixing, standard mechanical mechanisms may be used to affix the second hinged bracket (310B) to the rear side of the rack. Other mechanical or non-mechanical mechanisms for affixing the second hinged bracket (310B) to the rear side of the rack may be used without departing from the scope of the invention.

In one or more embodiments, the second hinged bracket (310B) includes a second base (311B), a second holder (312B), and a second hinge (313B). In one or more embodiments, the second base (311B) includes two portions, in which a first portion of the second base (311B) refers to a portion of the second base (311B) that is affixed to the rear side of the rack. A second portion of the second base (311B) refers to a portion of the second base (311B) that is affixed to a first portion of the second hinge (313B).

In one or more embodiments, as being a mechanical support component, the second base (311B) may provide structural support to the second hinge (313B) and to the second holder (312B) in case of a seismic event. The second base (311B) may also provide structural support to the second hinge (313B) to keep the second hinge (313B) connected to the second base (311B).

In one or more embodiments, standard mechanical mechanisms may be used to affix the first portion of the second base (311B) to the rear side of the rack. Similarly, standard mechanical mechanisms may be used to affix the second portion of the second base (311B) to the first portion of the second hinge (313B). Other mechanical or non-mechanical mechanisms for affixing (i) the first portion of the second base (311B) to the rear side of the rack and (ii) the second portion of the second base (311B) to the first portion of the second hinge (313B) may be used without departing from the scope of the invention.

In one or more embodiments, similar to the second base (311B), the second hinge (313B) includes two portions, in which a first portion of the second hinge (313B) refers to a portion of the second hinge (313B) that is affixed to the second portion of the second base (311B). A second portion of the second hinge (313B) refers to a portion of the second hinge (313B) that is affixed to a first portion of the second holder (313B).

In one or more embodiments, as being a mechanical support component, the second hinge (313B) may provide structural support to the second holder (312B) and to the second base (311B) in case of a seismic event. The second hinge (313B) may also provide structural support to the second holder (312B) to keep the second holder (312B) connected to the second hinge (313B). Further, the second hinge (313B) may provide one or more functionalities to the second holder (312B), as discussed below.

In one or more embodiments, standard mechanical mechanisms may be used to affix the first portion of the second hinge (313B) to the second portion of the second base (311B). Similarly, standard mechanical mechanisms may be used to affix the second portion of the second hinge (313B) to the first portion of the second holder (312B). Other mechanical or non-mechanical mechanisms for affixing (i) the first portion of the second hinge (313B) to the second portion of the second base (311B) and (ii) the second portion of the second hinge (313B) to the first portion of the second holder (312B) may be used without departing from the scope of the invention.

In one or more embodiments, similar to the second base (311B), the second holder (312B) includes two portions, in which a first portion of the second holder (312B) refers to a portion of the second holder (312B) that is affixed to the second portion of the second hinge (313B). A second portion of the second holder (312B) refers to a portion of the second holder (312B) that is connected to one or more ITCs, in which the second portion of the second holder (312B) hosts the ITCs. Said another way, the second portion of the second holder (312B) is configured to host the ITCs for a better power and/or cooling distribution, control, or communication.

With an ability to mount an ITC outside of the rack and with an ability to rotate the second holder (312B) about the second hinge (313B) (discussed below), a customer may mount one or more ITCs to the second portion of the second holder (312B) to increase power capacity and/or cooling capacity of the IHS to perform HPC tasks. In this manner, for example, (i) the customer may perform HPC tasks without worrying about the available space within the IHS, (ii) the customer may have a better cable (and/or liquid line) management at the rear side of the IHS, and (iii) the customer may have a better user experience and a better serviceability when removing or deploying a component (e.g., a computing device, a PDU, etc.) from or to the rack.

The aforementioned example is not intended to limit the scope of the invention.

Further, as being a mechanical support component, the second holder (312B) may provide structural support to the ITCs (e.g., 306B) in case of a seismic event. The second holder (312B) may also provide structural support to the ITCs (e.g., 306B) to keep the ITCs (e.g., 306B) connected to the second holder (e.g., 306B).

In one or more embodiments, standard mechanical mechanisms may be used to mount the ITCs (e.g., 306B) to the second portion of the second holder (312B). Other mechanical or non-mechanical mechanisms for mounting the ITCs (e.g., 306B) to the second portion of the second holder (312B) may be used without departing from the scope of the invention.

In one or more embodiments, similar to the first holder (312A), the second holder (312B) is also a rotatable component to provide an extension to the rack and to provide an extra space (together with the second base (311B)) at the rear side of the rack. Said another way, as shown in FIG. 3.1, the second hinged bracket (310B) extends the rear side of the rack (i) to host ITCs and (ii) to provide a better user experience and a better serviceability.

In one or more embodiments, the second holder (312B) is supported by the second hinge (313B) for rotation about a finite rotation angle relative to the fixed second base (311B), in which the second hinge (313B) may limit rotation of the second holder (312B) when the second holder (312B) is in an engaged position (discussed below). In one or more embodiments, the second holder (312B) may be in a disengaged position (as shown in FIG. 3.1), spaced apart from the second base (311B), or may be in an engaged position (see FIG. 3.2), proximate to the second base (311B). The second hinge (313B) is connected to both the second base (311B) and the second holder (312B) to rotate the second holder (312B) between a disengaged position and the engaged position, for example, to remove the computing device (301) from the rack.

The aforementioned example is not intended to limit the scope of the invention.

Those skilled in the art will appreciate that while the second holder (312B) is shown as being fixed to a particular disengaged position, the second holder (312B) may be fixed to any other disengaged position (within the rotation angle and while still providing the same functionalities) without departing from the scope of the invention.

In one or more embodiments, as described above, the second holder (312B) is rotatable with a finite rotation angle; however, the second hinge (313B) may act as a mechanical hard-stop component to prevent the second holder (312B) from rotating beyond the rotation angle. For example, after rotating inward (see the arrow in FIG. 3.2) about the second hinge (313B), the second holder (312B) may be fixed to the engaged position before getting closer to the rear side of the rack. As yet another example, after rotating outward about the second hinge (313B), the second holder (312B) may be fixed to a disengaged position before getting closer to the right side of the rack. Further, the second hinge (313B) may limit the rotation of the second holder (312B) relative to the second base (311B) to prevent any damage on cables and/or liquid lines that could otherwise occur from rotation of the second holder (312B).

The aforementioned example is not intended to limit the scope of the invention.

In one or more embodiments, the second holder (312B) and the ITCs are oriented in the first direction and after rotating inward or outward about the second hinge (313B), the second holder (312B) and the ITCs are oriented in a third direction, in which the second direction and the third direction are different or the same. Further, the second hinge (313B) may include a second solenoid to rotate the second holder (312B) between a disengaged position and the engaged position. A second controller component (not shown) may be connected to the second solenoid such that the second controller component may rotate the second holder (312B) toward one of pre-set disengaged positions. More specifically, the second controller component may be responsive to instructions recorded on the memory to rotate the second holder (312B) between one of the pre-set disengaged positions and the engaged position. For example, based on a received instruction, the second controller component may rotate the second holder (312B) from a disengaged position (as shown in FIG. 3.1) to the engaged position (as shown in FIG. 3.2) before shipping the system (e.g., 100, FIG. 1) to the customer site. As yet another example, based on a second received instruction, the second controller component may rotate the second holder (312B) from the engaged position to another disengaged position (not shown) to remove a PDU (e.g., 305C) from the rack.

The aforementioned examples are not intended to limit the scope of the invention.

In one or more embodiments, while described as a logically controlled component, the second holder (312B) may be operated manually by a customer. For example, a customer may physically rotate the second holder (312B) by pushing the second holder (312B) from a disengaged position to the engaged position. As yet another example, the customer may physically rotate the second holder (312B) by pushing the second holder (312B) from the engaged position to a disengaged position.

The aforementioned examples are not intended to limit the scope of the invention.

In one or more embodiments, for example, in order to (i) increase cooling efficiency of the MECC (e.g., 210, FIG. 2.1), (ii) reduce the amount of time of the MECC (e.g., 210, FIG. 2.1) needs to operate, (iii) reduce to dependency on the MECC (e.g., 210, FIG. 2.1), (iv) remove fans from the computing device (301), (v) reduce power usage of the computing device (301); (vi) enhance thermal management of the internal environment of the MITC (e.g., 220, FIG. 2.1), (vii) prevent damage to the hardware components of the computing device (301), and (viii) improve functionality of the hardware components of the computing devices (301), as part of the in-row cooling architecture, a customer may mount a DLC manifold (306B) to the second holder (312B).

The aforementioned examples are not intended to limit the scope of the invention.

In one or more embodiments, the rack manifold part of the DLC manifold (306B) includes liquid connectors to support DLC of the hardware components. For example, a CLP (shown with a dash-dotted line) is connected to the computing device (301) to deliver cold liquid to the computing device (301) to cool off the hardware components. As yet another example, a HLP (shown with a solid line) is connected to the computing device (301) to deliver heated cold liquid to the rack manifold. Further, the liquid connectors may provide blind-mating connection between the rack manifold part of the DLC manifold (306B) and the hardware components.

The aforementioned examples are not intended to limit the scope of the invention.

In one or more embodiments, the CDU manifold part of the DLC manifold (306B) includes a supply loop (not shown) having a supply inlet (not shown) and a return loop (not shown) having a return outlet (not shown). The supply inlet may be liquidly coupled to the secondary line and the return outlet may be liquidly coupled to the rack manifold part (and to the HLP). As their names imply, the supply inlet supplies cold working liquid to the CLP, while the return outlet returns hot working liquid from the rack manifold part of the DLC manifold (306B) to the CDU. In one or more embodiments, the CDU manifold part of the DLC manifold (306B) may be liquidly connected to the CDU.

In one or more embodiments, the bases (311A, 311B), the holders (312A, 312B), and the hinges (313A, 313B) may be made of, for example (but not limited to): galvanized steel, stainless steel, sheet metal, aluminum, glass-fiber reinforced plastic, etc.

Those skilled in the art will appreciate that while the bases (311A, 311B), the holders (312A, 312B), and the hinges (313A, 313B) are shown as having a particular size, shape, and placement, the bases (311A, 311B), the holders (312A, 312B), and the hinges (313A, 313B) may have any size, shape, and placement (while still providing the same functionalities) without departing from the scope of the invention.

In one or more embodiments, the hinged brackets (310A, 310B) may be a part of the IHS. Said another way, the hinged brackets (310A, 310B)-integrated IHS may be manufactured as a monolithic component. This implies that the hinged brackets (310A, 310B) are not separate, standalone components. In one or more embodiments, the hinged brackets (310A, 310B) may be removable components such that, when necessary, the hinged brackets (310A, 310B) may be attached to, or detached from the IHS. Further, the removable hinged brackets (310A, 310B) are suitable to be attached to both standard and custom designed IHSs.

Turning now to FIG. 3.2, FIG. 3.2 shows a top view of a portion of the IHS (shown in FIG. 3.1) in accordance with one or more embodiments of the invention. In an embodiment of the invention shown in FIG. 3.2, the first holder (312A) is rotated inward (shown with an arrow) about the first hinge (313A) in order to change the orientation of the first holder (312A) from a disengaged position (see FIG. 3.1) to the engaged position. Similarly, the second holder (312B) is rotated inward (shown with an arrow) about the second hinge (313B) in order to change the orientation of the second holder (312B) from a disengaged position (see FIG. 3.1) to the engaged position. In this manner, for example, a customer may prepare the IHS before shipping the system (e.g., 100, FIG. 1) to the customer site.

The aforementioned example is not intended to limit the scope of the invention.

In one or more embodiments, after the orientation of the first holder (312A) changes from the disengaged position to the engaged position, the CLP (307) and the HLP (308) of the DLC manifold (306A) shrink to adapt the orientation change. Similarly, after the orientation of the second holder (312B) changes from the disengaged position to the engaged position, the CLP and the HLP of the DLC manifold (306B) also shrink to adapt the orientation change.

In one or more embodiments, after the orientation of the first holder (312A) changes from the disengaged position to the engaged position, the first holder (312A) may be rotated outward (not shown) about the first hinge (313A) in order to change the orientation of the first holder (312A) from the engaged position to the same or a different disengaged position. Similarly, after the orientation of the second holder (312B) changes from the disengaged position to the engaged position, the second holder (312B) may be rotated outward (not shown) about the second hinge (313B) in order to change the orientation of the second holder (312B) from the engaged position to the same or a different disengaged position. In this manner, for example, the customer may remove the computing device (301) and/or the PDUs (305B, 305C) from the rack.

The aforementioned example is not intended to limit the scope of the invention.

In one or more embodiments, after the orientation of the first holder (312A) changes from the engaged position to a disengaged position, the CLP (307) and the HLP (308) of the DLC manifold (306A) expand to adapt the orientation change. Similarly, after the orientation of the second holder (312B) changes from the engaged position to a disengaged position, the CLP and the HLP of the DLC manifold (306B) also expand to adapt the orientation change.

FIGS. 4.1 and 4.2 show top views of an IHS in accordance with one or more embodiments of the invention.

Turning now to FIG. 4.1, FIG. 4.1 shows a top view of an IHS in accordance with one or more embodiments of the invention. In an embodiment of the invention shown in FIG. 4.1, the components may be the same as the components of the embodiment shown in FIG. 3.1, except the IHS shown in FIG. 4.1 has different structural characteristics than the IHS shown in FIG. 3.1. For example, the configuration of the ITCs is different. As yet another example, the size of the computing device (401) and the size of the holders (412A, 412B) are different (e.g., larger).

In one or more embodiments, when a larger computing device (e.g., computing device (401)) is deployed into the rack, more ITCs may need to be mounted to the holders (412A, 412B). For this reason, an ITC mounting capacity of each holder needs to be increased.

In one or more embodiments, if the holders (412A, 412B) are adjustable holders, the holders (412A, 412B) may become larger (comparing to their sizes in FIG. 3.1) by pulling out the second portion of each holder. In this manner, the ITC mounting capacity of each holder may be increased. In one or more embodiments, if the holders (412A, 412B) are monolithic components, the holders (412A, 412B) may be replaced with larger holders to increase the ITC mounting capacity of each holder. Details of the holders (and other components shown in FIG. 4.1) are described above in reference to FIG. 3.1.

In one or more embodiments, the hinged brackets (410A, 410B) may be a part of the IHS. Said another way, the hinged brackets (410A, 410B)-integrated IHS may be manufactured as a monolithic component. This implies that the hinged brackets (410A, 410B) are not separate, standalone components. In one or more embodiments, the hinged brackets (410A, 410B) may be removable components such that, when necessary, the hinged brackets (410A, 410B) may be attached to, or detached from the IHS. Further, the removable hinged brackets (410A, 410B) are suitable to be attached to both standard and custom designed IHSs.

Turning now to FIG. 4.2, FIG. 4.2 shows a top view of a portion of the IHS (shown in FIG. 4.1) in accordance with one or more embodiments of the invention. In an embodiment of the invention shown in FIG. 4.2, the first holder (412A) is rotated inward (shown with an arrow) about the first hinge (413A) in order to change the orientation of the first holder (412A) from a disengaged position (see FIG. 4.1) to the engaged position. Similarly, the second holder (412B) is rotated inward (shown with an arrow) about the second hinge (413B) in order to change the orientation of the second holder (412B) from a disengaged position (see FIG. 4.1) to the engaged position. In this manner, for example, a customer may prepare the IHS before shipping the system (e.g., 100, FIG. 1) to the customer site.

The aforementioned example is not intended to limit the scope of the invention.

In one or more embodiments, after the orientation of the first holder (412A) changes from the disengaged position to the engaged position, the CLP (407) (shown with a dash-dotted line) and the HLP (408) (shown with a solid line) of the DLC manifold (406A) shrink to adapt the orientation change. Similarly, after the orientation of the second holder (412B) changes from the disengaged position to the engaged position, the CLP (shown with a dash-dotted line) and the HLP (shown with a solid line) of the DLC manifold (406B) also shrink to adapt the orientation change. Further, after the orientation of the first holder (412A) changes from the disengaged position to the engaged position, the power whip (PW) (415, shown with a double solid line) of the PDU (405C) shrinks to adapt the orientation change.

In one or more embodiments, after the orientation of the first holder (412A) changes from the disengaged position to the engaged position, the first holder (412A) may be rotated outward (not shown) about the first hinge (413A) in order to change the orientation of the first holder (412A) from the engaged position to the same or a different disengaged position. Similarly, after the orientation of the second holder (412B) changes from the disengaged position to the engaged position, the second holder (412B) may be rotated outward (not shown) about the second hinge (413B) in order to change the orientation of the second holder (412B) from the engaged position to the same or a different disengaged position. In this manner, for example, the customer may remove the computing device (401) and/or the PDUs (405A, 405B) from the rack.

The aforementioned example is not intended to limit the scope of the invention.

In one or more embodiments, after the orientation of the first holder (412A) changes from the engaged position to a disengaged position, the CLP (407) and the HLP (408) of the DLC manifold (406A) expand to adapt the orientation change. Similarly, after the orientation of the second holder (412B) changes from the engaged position to a disengaged position, the CLP and the HLP of the DLC manifold (406B) also expand to adapt the orientation change. Further, after the orientation of the first holder (412A) changes from the engaged position to a disengaged position, the PW (415) of the PDU (405C) expands to adapt the orientation change.

In one or more embodiments, using the above-described hinged brackets, a customer may increase power capacity and/or cooling capacity of the IHS to perform HPC tasks without worrying about the cable management related issues at the rear side of the IHS and without worrying about the available space within the IHS.

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular information technology component (MITC), comprising:
    a first information handling system (IHS);
    a utility control component (UCC), wherein the UCC is integrated within the MITC to:
        detect and manage a temperature within the first IHS,
        detect and suppress a fire within a second IHS that is deployed to the MITC,
        manage a power distribution to the second IHS from a modular power supply component (MPSC), wherein the MPSC is designed based on a hurricane rating of a location that the MITC is deployed,
        form a UCC-integrated MITC, wherein the UCC-integrated MITC is manufactured as a monolithic system; and
    a first hinged bracket,
        wherein the first hinged bracket comprises a first hinge, a first base, and a first holder,
        wherein a first portion of the first base is connected to the first IHS, wherein a second portion of the first base is connected to the first hinge,
        wherein a first portion of the first holder is connected to the first hinge, wherein a second portion of the first holder is connected to a first information technology component (ITC), wherein the first holder and the first ITC are oriented in a first direction, and
        wherein, after rotating inward or outward about the first hinge, the first holder and the first ITC are oriented in a second direction, wherein the first direction and the second direction are different.

2. The MITC of claim 1, wherein the first ITC is a direct liquid cooling (DLC) manifold or a power distribution unit (PDU).

3. The MITC of claim 2,
    wherein the DLC manifold comprises a cold liquid pipe and a hot liquid pipe,
    wherein the cold liquid pipe is connected to the first IHS, wherein the cold liquid pipe delivers cold liquid to the first IHS to cool off the first IHS, and
    wherein the hot liquid pipe is connected to the first IHS, wherein the hot liquid pipe delivers heated cold liquid to the DLC manifold.

4. The MITC of claim 2,
    wherein the PDU comprises cables,
    wherein the cables are connected to the first IHS, and
    wherein the cables transmit power to the first IHS.

5. The MITC of claim 1, wherein the MITC further comprises a second hinged bracket,
    wherein the second hinged bracket comprises a second hinge, a second base, and a second holder,
    wherein a first portion of the second base is connected to the first IHS, wherein a second portion of the second base is connected to the second hinge,
    wherein a first portion of the second holder is connected to the second hinge, wherein a second portion of the second holder is connected to a second ITC, wherein the second holder and the second ITC are oriented in the first direction, and
    wherein, after rotating inward or outward about the second hinge, the second holder and the second ITC are oriented in a third direction, wherein the second direction and the third direction are different or the same.

6. The MITC of claim 1, wherein the first IHS comprises a rack and a plurality of computing devices, wherein the rack is a housing for the plurality of computing devices.

7. A modular data center, comprising:
    a modular information technology component (MITC), wherein the MITC comprises a first information handling system (IHS), a utility control component (UCC), and a first hinged bracket,
        wherein the UCC is integrated within the MITC to:
            detect and manage a temperature within the first IHS,
            detect and suppress a fire within a second IHS that is deployed to the MITC,
            manage a power distribution to the second IHS from a modular power supply component (MPSC), wherein the MPSC is designed based on a hurricane rating of a location that the MITC is deployed,
form a UCC-integrated MITC, wherein the UCC-integrated MITC is manufactured as a monolithic system,
wherein the first hinged bracket comprises a first hinge, a first base, and a first holder,
wherein a first portion of the first base is connected to the first IHS, wherein a second portion of the first base is connected to the first hinge,
wherein a first portion of the first holder is connected to the first hinge, wherein a second portion of the first holder is connected to a first information technology component (ITC), wherein the first holder and the first ITC are oriented in a first direction, and
wherein, after rotating inward or outward about the first hinge, the first holder and the first ITC are oriented in a second direction, wherein the first direction and the second direction are different; and
a modular environmental control component (MECC),
wherein the MECC comprises a plurality of environmental control components (ECCs) and built-in airflow connection components, wherein the built-in airflow connection components remove and supply air to the MITC.

8. The modular data center of claim 7, wherein the first ITC is a direct liquid cooling (DLC) manifold or a power distribution unit (PDU).

9. The modular data center of claim 8,
wherein the DLC manifold comprises a cold liquid pipe and a hot liquid pipe,
wherein the cold liquid pipe is connected to the first IHS, wherein the cold liquid pipe delivers cold liquid to the first IHS to cool off the first IHS, and
wherein the hot liquid pipe is connected to the first IHS, wherein the hot liquid pipe delivers heated cold liquid to the DLC manifold.

10. The modular data center of claim 8,
wherein the PDU comprises cables,
wherein the cables are connected to the first IHS, and
wherein the cables transmit power to the first IHS.

11. The modular data center of claim 7, wherein the MITC further comprises a second hinged bracket,
wherein the second hinged bracket comprises a second hinge, a second base, and a second holder,
wherein a first portion of the second base is connected to the first IHS, wherein a second portion of the second base is connected to the second hinge, wherein a first portion of the second holder is connected to the second hinge,
wherein a second portion of the second holder is connected to a second ITC, wherein the second holder and the second ITC are oriented in the first direction, and
wherein, after rotating inward or outward about the second hinge, the second holder and the second ITC are oriented in a third direction, wherein the second direction and the third direction are different or the same.

12. The modular data center of claim 7, wherein the first IHS comprises a rack and a plurality of computing devices, wherein the rack is a housing for the plurality of computing devices.

13. An information handling system (IHS), comprising:
a rack;
a computing device;
a hinged bracket,
wherein the hinged bracket comprises a hinge, a base, and a holder,
wherein a first portion of the base is connected to the rack, wherein a second portion of the base is connected to the hinge,
wherein a first portion of the holder is connected to the hinge, wherein a second portion of the holder is connected to an information technology component (ITC), wherein the holder and the ITC are oriented in a first direction,
wherein, after rotating inward or outward about the hinge, the holder and the ITC are oriented in a second direction, wherein the first direction and the second direction are different,
wherein the ITC is a direct liquid cooling (DLC) manifold or a power distribution unit (PDU),
wherein the PDU transmits power from a modular power supply component (MPSC) to the computing device, and
wherein the MPSC is designed by considering a hurricane rating of a location that the IHS is deployed.

14. The IHS of claim 13, wherein the IHS further comprises a second computing device,
wherein the DLC manifold comprises a cold liquid pipe and a hot liquid pipe,
wherein the cold liquid pipe is connected to the second computing device, wherein the cold liquid pipe delivers cold liquid to the second computing device to cool off the second computing device, and
wherein the hot liquid pipe is connected to the second computing device, wherein the hot liquid pipe delivers heated cold liquid to the DLC manifold.

15. The IHS of claim 13,
wherein the PDU comprises cables,
wherein the cables are connected to the computing device, and
wherein the cables transmit power to the computing device.

* * * * *